(12) United States Patent
Fein et al.

(10) Patent No.: US 8,694,932 B2
(45) Date of Patent: Apr. 8, 2014

(54) LAYOUT DETERMINATION

(75) Inventors: Gene Fein, Malibu, CA (US); Edward Merritt, Lenox, MA (US)

(73) Assignee: Empire Technology Development LLC, Wilmington, DE (US)

( * ) Notice: Subject to any disclaimer, the term of this patent is extended or adjusted under 35 U.S.C. 154(b) by 1143 days.

(21) Appl. No.: 12/200,271

(22) Filed: Aug. 28, 2008

(65) Prior Publication Data
US 2010/0058268 A1    Mar. 4, 2010

(51) Int. Cl.
*G06F 17/50* (2006.01)

(52) U.S. Cl.
USPC ............................ 716/104; 716/132; 716/139

(58) Field of Classification Search
USPC .......................................... 716/104, 132, 139
See application file for complete search history.

(56) References Cited

U.S. PATENT DOCUMENTS

2005/0051809 A1 *  3/2005  Smith et al. ................... 257/232

OTHER PUBLICATIONS

"Cloud Computing" retrieved from http://enwikipedia.org/wiki/Cloud_computing, Jun. 25, 2008.

* cited by examiner

*Primary Examiner* — Thuan Do
(74) *Attorney, Agent, or Firm* — Foley & Lardner LLP

(57) ABSTRACT

A device includes a processor and a computer-readable medium including computer-readable instructions. Upon execution by the processor, the computer-readable instructions cause the device to receive a first request from a second device, where the first request is a layout request that includes an identification of a space. The computer-readable instructions also cause the device to provide a second request to a third device, where the second request includes the identification of the space. The computer-readable instructions also cause the device to receive one or more dimension corresponding to the space, and to provide the one or more dimension to the third device. The computer-readable instructions further cause the device to receive a generated layout from the third device, and to provide the generated layout to the second device.

14 Claims, 6 Drawing Sheets

LAYOUT DETERMINATION

BACKGROUND

The layout of a given area can be based on many factors, including the type of the area, the location of the area, the value of the area, design preferences, etc. For example, the layout of a typical living room may include a couch, a love seat, a fireplace, and an entertainment center. The layout of the typical living room may also include flooring, which can be wood, tile and grout, carpet, vinyl, etc. The layout of an athletic field may include turf, bleachers, player benches, goals, concession stands, restroom facilities, etc. Planning the layout for a given area can include selecting the type and quantity of materials to placed in the area.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
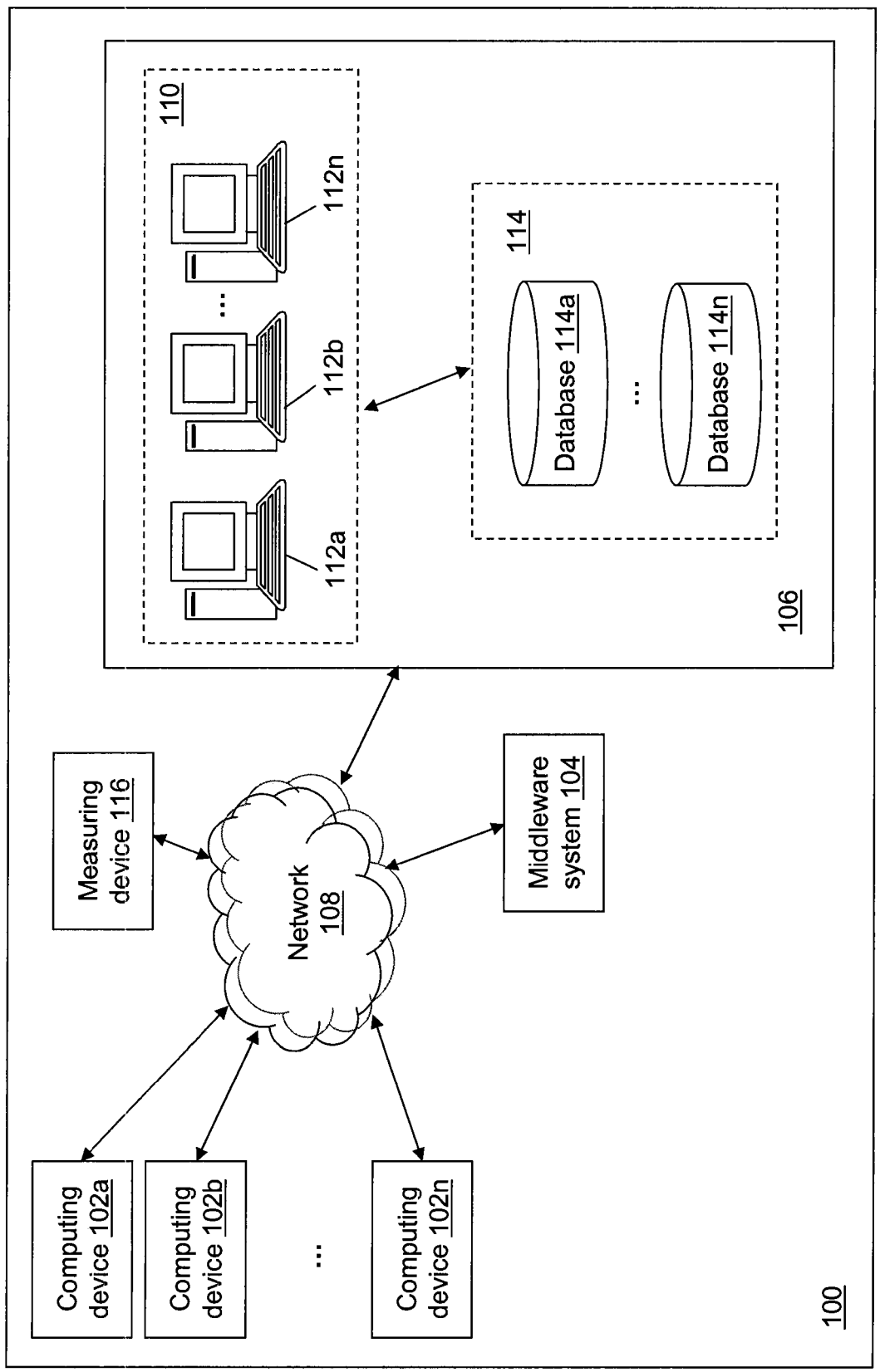
FIG. 1 depicts a block diagram of a layout determination system in accordance with an illustrative embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

Illustrative systems, methods, devices, computer-readable media, etc. are described for determining a layout. In an illustrative embodiment, a layout can be determined using a middleware system and a cloud computing system. The middleware system, which can be used in part to facilitate communication between the cloud computing system and a user computing device, can receive a layout request and dimensions of a space whose layout is to be determined. The middleware system can provide the layout request and the dimensions to the cloud computing system. The middleware system can also receive layout options, provide the layout options to the user computing device, receive layout selections from the user computing device, and provide the layout selections to the cloud computing system. The cloud computing system can generate the layout based at least in part on the dimensions and the layout selections. The middleware can provide the generated layout to the user computing device.

With reference to FIG. 1, a block diagram of a layout determination system 100 is shown in accordance with an illustrative embodiment. Layout determination system 100 can include one or more user computing devices 102a, 102b, . . . , 102n, a middleware system 104, a cloud computing system 106, and a measuring device 116. The one or more user computing devices 102a, 102b, . . . , 102n may be a computer of any form factor including a laptop, a desktop, a server, an integrated messaging device, a personal digital assistant, a cellular telephone, an ipod, etc. Measuring device 116 can be a manual or automated rangefinder which is configured to identify a perimeter of an area. Alternatively, any other type of measuring device known to those of skill in the art may be used. The devices associated with the one or more user computing devices 102a, 102b, . . . , 102n, middleware system 104, cloud computing system 106, and measuring device 116 may communicate with each other using a network 108.

Network 108 may include one or more type of network including a cellular network, a peer-to-peer network, the Internet, a local area network, a wide area network, a Wi-Fi network, a Bluetooth™ network, etc. Cloud computing system 106 can include one or more servers 110 and one or more databases 114. A cloud computing system refers to one or more computational resources accessible over a network to provide users on-demand computing services. The one or more servers 110 can include one or more computing devices 112a, 112b, . . . , 112n which may be computers of any form factor. The one or more databases 114 can include a first database 114a, . . . , and an nth database 114n. The one or more databases 114 can be housed on one or more of the one or more servers 110 or may be housed on separate computing devices accessible by the one or more servers 110 directly through wired or wireless connection or through network 108. The one or more databases 114 may be organized into tiers and may be developed using a variety of database technologies without limitation. The components of cloud computing system 106 may be implemented in a single computing device or a plurality of computing devices in a single location, in a single facility, and/or may be remote from one another.

Figure 2:
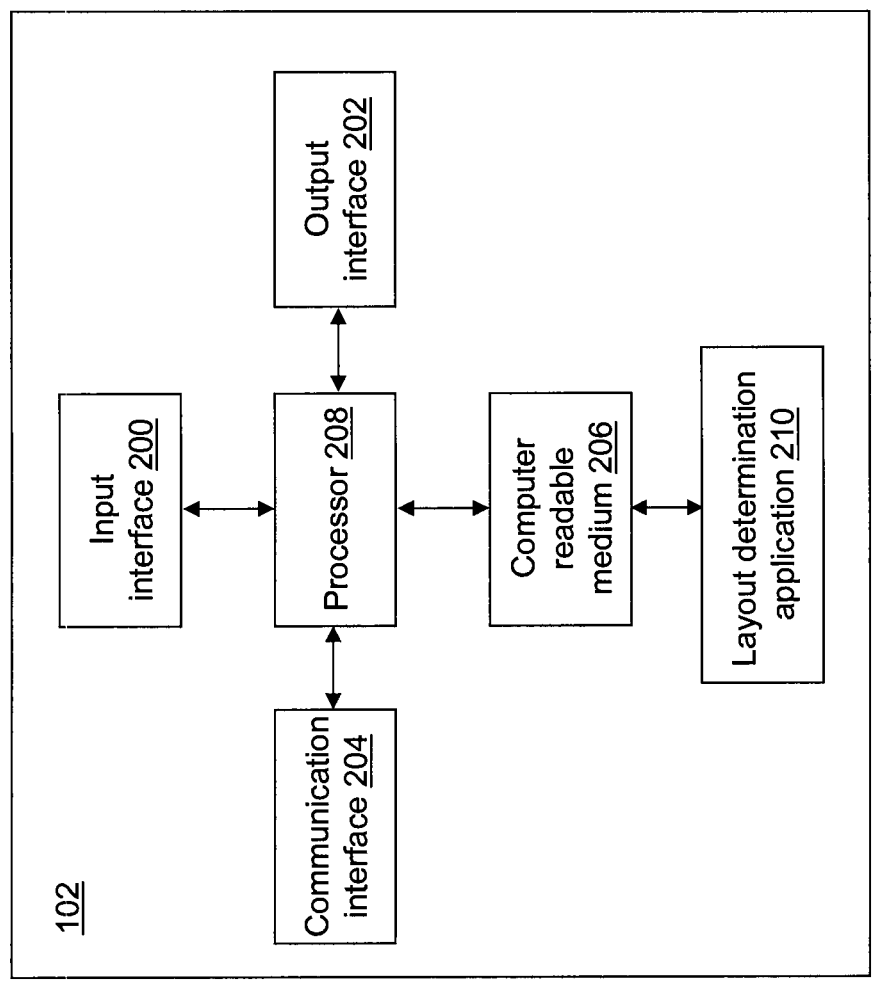
FIG. 2 depicts a block diagram of a user computing device of the layout determination system of FIG. 1 in accordance with an illustrative embodiment.

With reference to FIG. 2, a block diagram of a user computing device 102 of layout determination system 100 is shown in accordance with an illustrative embodiment. User computing device 102 can include an input interface 200, an output interface 202, a communication interface 204, a computer-readable medium 206, a processor 208, and a layout determination application 210. Different and additional components may be incorporated into user computing device 102 without limitation. Layout determination application 210 provides a graphical user interface with user selectable and controllable functionality. Layout determination application 210 may include a browser application or other user interface based application that interacts with middleware system 104 to allow a user to request a layout, provide selections of layout options to middleware system 104, and receive a generated layout from middleware system 104.

Input interface 200 provides an interface for receiving information from the user for entry into user computing device 102 as known to those skilled in the art. Input interface 200 may interface with various input technologies including, but not limited to, a keyboard, a pen and touch screen, a mouse, a track ball, a touch screen, a keypad, one or more buttons, etc. to allow the user to enter information into user computing device 102 or to make selections presented in a user interface displayed using a display under control of layout determination application 210. Input interface 104 may provide both an input and an output interface. For example, a touch screen both allows user input and presents output to the user. User computing device 102 may have one or more input interfaces that use the same or a different interface technology.

Output interface 202 provides an interface for outputting information for review by a user of user computing device 102. For example, output interface 202 may include an interface to a display, a printer, a speaker, etc. The display may be any of a variety of displays including, but not limited to, a thin film transistor display, a light emitting diode display, a liquid crystal display, etc. The printer may be any of a variety of printers including, but not limited to, an ink jet printer, a laser printer, etc. User computing device 102 may have one or more output interfaces that use the same or a different interface technology.

Communication interface 204 provides an interface for receiving and transmitting data between devices using various protocols, transmission technologies, and media. The communication interface may support communication using various transmission media that may be wired or wireless. User computing device 102 may have one or more communication interfaces that use the same or different protocols, transmission technologies, and media.

Computer-readable medium 206 is an electronic holding place or storage for information so that the information can be accessed by processor 208. Computer-readable medium 206 can include, but is not limited to, any type of random access memory (RAM), any type of read only memory (ROM), any type of flash memory, etc. such as magnetic storage devices (e.g., hard disk, floppy disk, magnetic strips, . . . ), optical disks (e.g., compact disk (CD), digital versatile disk (DVD), . . . ), smart cards, flash memory devices, etc. User computing device 102 may have one or more computer-readable media that use the same or a different memory media technology. User computing device 102 also may have one or more drives that support the loading of a memory media such as a CD, a DVD, a flash memory card, etc.

Processor 208 executes instructions as known to those skilled in the art. The instructions may be carried out by a special purpose computer, logic circuits, or hardware circuits. Thus, processor 208 may be implemented in hardware, firmware, software, or any combination of these methods. The term "execution" is the process of running an application or the carrying out of the operation called for by an instruction. The instructions may be written using one or more programming language, scripting language, assembly language, etc. Processor 208 executes an instruction, meaning that it performs the operations called for by that instruction. Processor 208 operably couples with input interface 200, with output interface 202, with communication interface 204, and with computer-readable medium 206 to receive, to send, and to process information. Processor 208 may retrieve a set of instructions from a permanent memory device and copy the instructions in an executable form to a temporary memory device that is generally some form of RAM. User computing device 102 may include a plurality of processors that use the same or a different processing technology.

Figure 3:
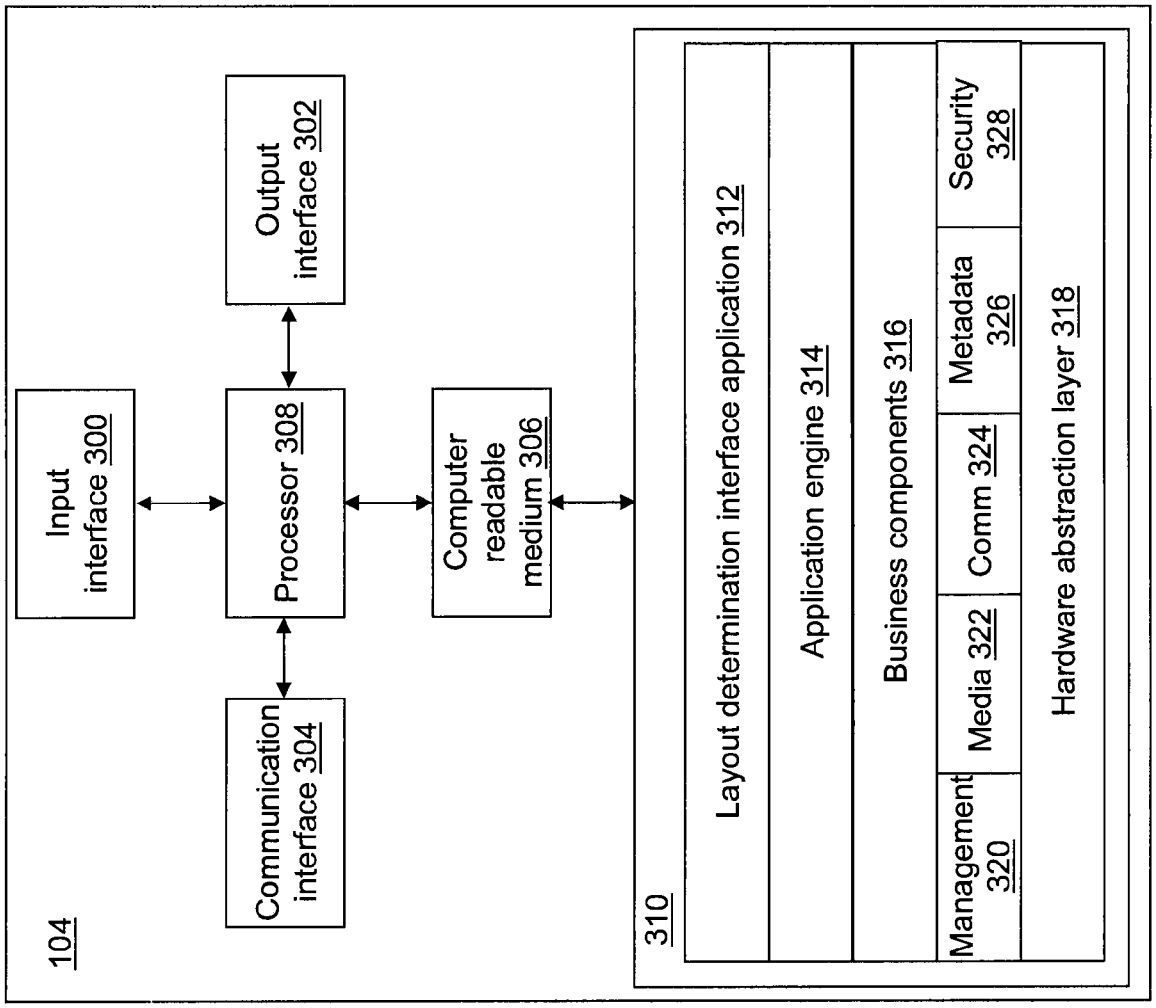
FIG. 3 depicts a block diagram of a middleware system of the layout determination system of FIG. 1 in accordance with an illustrative embodiment.

With reference to FIG. 3, a block diagram of middleware system 104 of layout determination system 100 is shown in accordance with an illustrative embodiment. Middleware system 104 can include an input interface 300, an output interface 302, a communication interface 304, a computer-readable medium 306, a processor 308, and layout determination architecture 310. Different and additional components may be incorporated into middleware system 104 without limitation. For example, middleware system 104 may include a database that is directly accessible by middleware system 104 or accessible by middleware system 104 using a network. Middleware system 104 may further include a cache for temporarily storing information communicated to middleware system 104. Input interface 300 provides similar functionality to input interface 200. Output interface 302 provides similar functionality to output interface 202. Communication interface 304 provides similar functionality to communication interface 204. Computer-readable medium 306 provides similar functionality to computer-readable medium 206. Processor 308 provides similar functionality to processor 208.

Layout determination architecture 310 can include a layout determination interface application 312, an application engine 314, business components 316, and a hardware abstraction layer 318. Layout determination interface application 312 includes the operations associated with interfacing between cloud computing system 106 and user computing device 102 to process a request for a layout, to receive selections of layout options from user computing device 102, to provide the selected layout options to cloud computing system 106, to receive a generated layout from cloud computing system 106, and/or to provide the generated layout to user computing device 102. Layout determination architecture 310 includes functionality to support input layout measurements, input scanned or otherwise automatically input layout info, input manual measurements, present layout options, present layout options with certain defined specifications such as material sizes, trim, color pattern, edging, design, space between design elements, return design rendering, send options to third parties/third party devices, break down number of specific materials needed, create materials list, show cost of materials, show estimated cost of labor, order materials from vendor. A use rating and durability rating may also be estimated based upon the materials and design of the project, weighed against the likely uses of the project. Layout determination architecture 310 also includes functionality to consider the size of the space to be laid out, minus the size of materials, minus the edging and the spacing between materials to determine possible configurations, specific numbers of materials needed, and projected associated costs.

Figure 4:
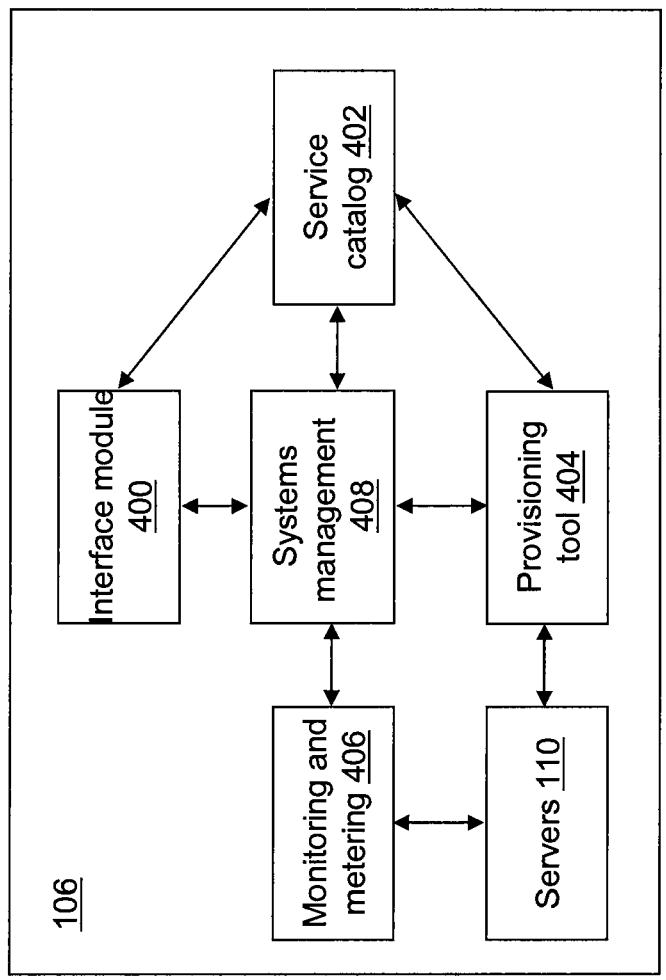
FIG. 4 depicts a block diagram of a cloud computing system of the layout determination system of FIG. 1 in accordance with an illustrative embodiment.

With reference to FIG. 4, a block diagram of modules associated with cloud computing system 106 of layout determination system 100 is shown in accordance with an illustrative embodiment. Cloud computing system 106 can include an interface module 400, a service catalog 402, a provisioning tool 404, a monitoring and metering module 406, a system management module 408, and the one or more servers 110. Different and additional components may be incorporated into cloud computing system 106 without limitation. For example, cloud computing system 106 may further include the one or more databases 114. Middleware system 104 interacts with interface module 400 to request services. Service catalog 402 provides a list of services that middleware system 104 can request. Provisioning tool 404 allocates computational resources from the one or more servers 110 and the one or more databases 114 to provide the requested service and may deploy received information for generation of a layout at the one or more servers 110. Monitoring and metering module 406 tracks the usage of the one or more servers 110 so the resources used can be attributed to a certain user possibly for billing purposes. System management module 408 manages the one or more servers 110. The one or more servers 110 can be interconnected as if in a grid running in parallel.

Interface module 400 may be configured to allow selection of a service from service catalog 402. A request associated with a selected service may be sent to system management module 408. System management module 408 identifies an available resource(s) such as one or more of servers 110 and/or one or more of databases 114. System management module 408 calls provisioning tool 404 to allocate the identified resource(s). Provisioning tool 404 may deploy a requested stack or web application as well.

Figure 5:
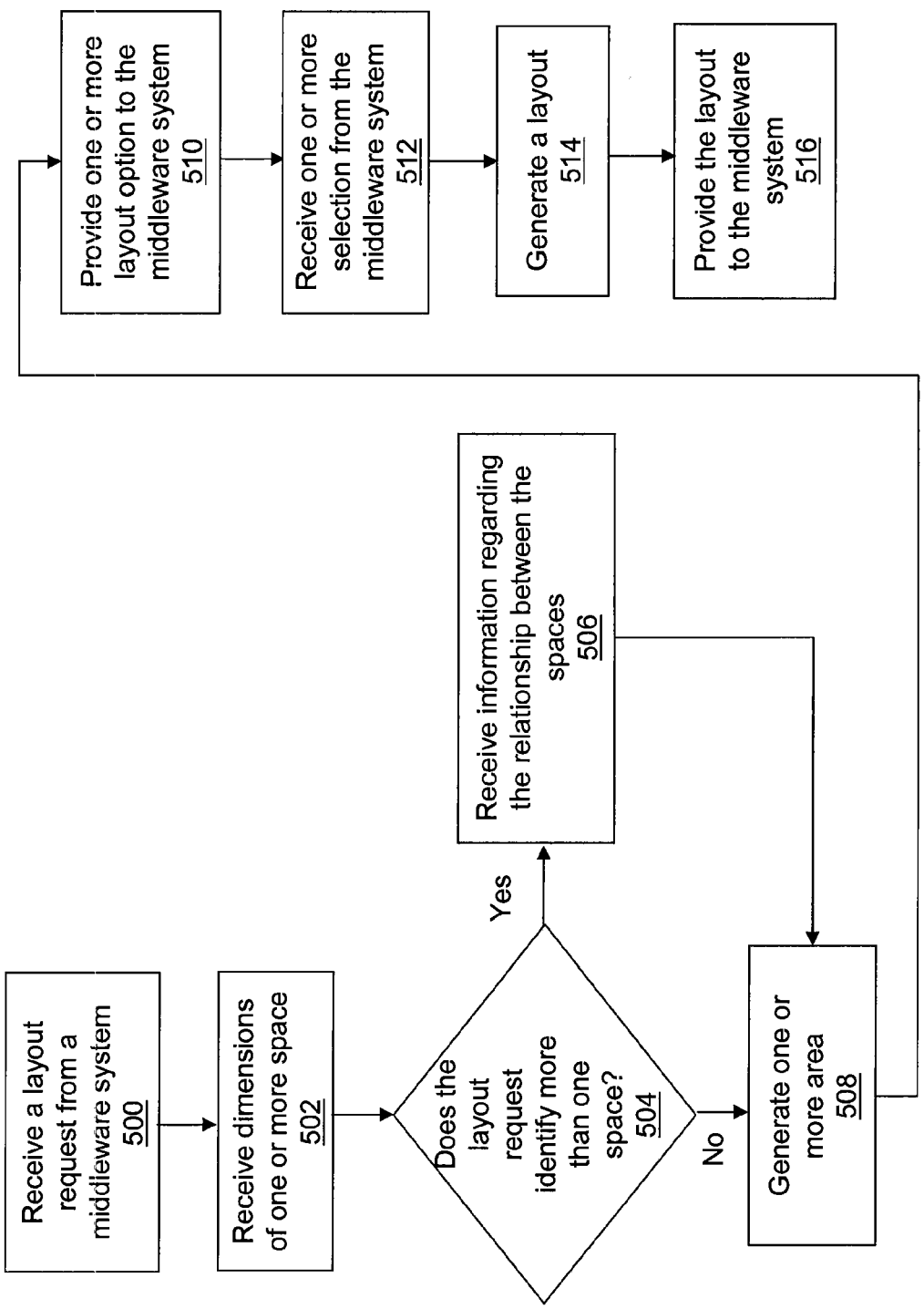
FIG. 5 depicts a flow diagram illustrating operations performed by the cloud computing system of FIG. 4 in accordance with an illustrative embodiment.

With reference to FIG. 5, illustrative operations performed by cloud computing system 106 are described. Additional, fewer, or different operations may be performed, depending on the embodiment. The order of presentation of the operations of FIG. 5 is not intended to be limiting. In an operation 500, a layout request is received from middleware system 104. The layout request can be a request for a simulated layout of one or more space. For example, the layout request may be for tile and grout for the floor of a bathroom, for sod for an athletic field, for trees to be planted in an open space, for plants to be planted in a garden, for the placement of vehicles on a car lot, for road design, for swimming pool design, for merchandise placement in a department or grocery store, for lighting layout, etc. In an illustrative embodiment, the layout request can identify the type of space (i.e., bedroom, living room, kitchen, exercise room, garage, indoor athletic field, outdoor athletic field, open field, garden, road, swimming pool, car lot, ceiling, etc.) for which the layout is to be determined.

In an operation 502, dimensions of the one or more space are received. In one embodiment, the dimensions can be received from middleware system 104. Alternatively, the dimensions may be received directly from measurement device 116. In an illustrative embodiment, the dimensions can correspond to a perimeter of the one or more space. For example, the dimensions can correspond to the perimeter of a kitchen floor which is to receive tile and grout. Measurement device 116, which may be a laser-based distance determination device, can be mounted at a static location in the kitchen. Measurement device 116 can be manually or automatically rotated about the kitchen to determine a perimeter of the kitchen based on reflections from the kitchen walls, cabinets, etc. Depending on the shape of the kitchen, measurement device 116 may be placed at more than one static location to determine an accurate representation of the kitchen perimeter. Alternatively, the dimensions may be obtained using a tape measure or other manual device. In open spaces (i.e., with no walls) such as fields, doorways, etc., reflectors may be placed around the perimeter such that measurement device 116 is able to determine the dimensions.

In an operation 504, a determination is made regarding whether the layout request identifies more than one space. If the layout request identifies more than one space, information regarding the relationship between the spaces is received in an operation 506. The information can may be requested by cloud computing system 106, or automatically received from middleware system 104. The information can indicate that each space is a distinct space which is independent of the other spaces, that two or more spaces are at least partially adjacent to one another, that two or more spaces are at different elevations, etc. The information can also indicate how a first space is situated with respect to a second adjacent space such that an accurate layout of the composite space including the first space and the second space can be obtained. Regardless of the number of spaces, in an operation 508, one or more area is generated based on the dimensions and/or the received information. If the layout request is for a single space, a single area corresponding to the single space can be generated. If the layout request is for two or more spaces which are at least partially adjacent to one another, a composite area corresponding to the two or more spaces can be generated. If the layout request is for two or more spaces which are not adjacent to one another, two or more distinct areas can be generated.

In an operation 510, one or more layout option is provided to middleware system 104. The layout option can be one or more option regarding components to be placed in the one or more space such that the layout can be generated and simulated. The layout option can include the type(s) of components to be placed in the space, the brand of the components, the cost of the components, the size of the components, the shape of the components, the color of the components, etc. For example, in the context of a layout for flooring in a room, the layout option can include a type of flooring, a pattern of the flooring, a brand of the flooring, a cost of the flooring, a color of the flooring, etc. In an operation 512, one or more selection of the one or more layout option is received from middleware system 104. In an illustrative embodiment, provision of the one or more layout option and receipt of the one or more selection can be iterative. For example, a first layout option may request a type of component to be placed in the space, and a first selection may indicate that the layout is to include flooring only. A second layout option may request a type of flooring, and a second selection may indicate tile and grout. A third layout option may request a shape and color of the tile, and a third selection can identify the shape and the color of the tile. A fourth layout option may request a base to be placed underneath the tile, a fifth layout option may request a width of the grout to be used between tiles, a sixth layout option may request whether grout or tile is to be placed adjacent to the perimeter of the room, and so on.

In an operation 514, a layout is generated, and in an operation 516 the generated layout is provided to middleware system 104. In an illustrative embodiment, the layout can be determined based on the one or more selection, the received dimensions of the one or more space, and the generated one or more area. The layout can identify an amount of materials for satisfying the one or more selection and/or a cost of the materials. The layout can also be detailed. For example, a tile layout can include partial tiles. The layout can also include a real time visual simulation of the generated layout. In another illustrative embodiment, the layout can be dynamic such that an end user can change the one or more selection, the dimensions, etc. to see how the layout changes in real time. In one embodiment, the layout can also include tips and/or suggestions based at least in part on previously generated layouts or predetermined layouts which may be created with the assistance of design experts.

Figure 6:
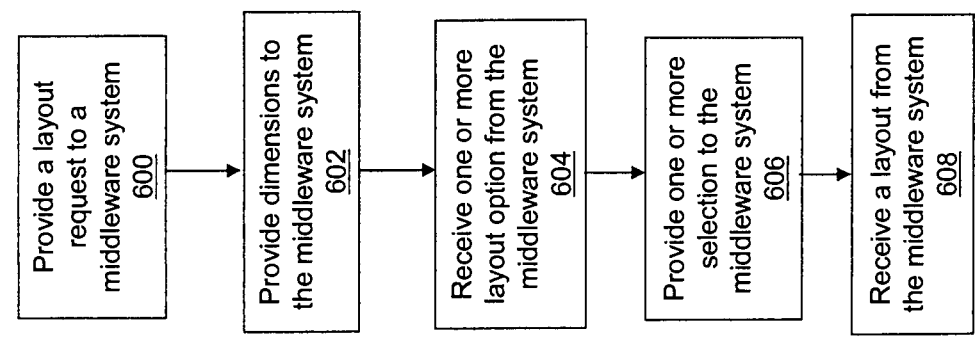
FIG. 6 depicts a flow diagram illustrating operations performed by the user computing device of FIG. 2 in accordance with an illustrative embodiment.

With reference to FIG. 6, illustrative operations performed by user computing device 102 are described. Additional, fewer, or different operations may be performed, depending on the embodiment. The order of presentation of the operations of FIG. 6 is not intended to be limiting. In an operation 600, a layout request is provided to middleware system 104. In an illustrative embodiment, the layout request can include a type of one or more space for which the layout is requested. If the layout request is with respect to more than one space, the layout request can also include information regarding the relationship between the spaces. In an operation 602, dimensions of the one or more space are provided to middleware system 104. The dimensions can be obtained from measurement device 116, from a tape measure, or using any other measurement method. In an alternative embodiment, the dimensions may automatically be provided from measurement device 116 to middleware system 104 and/or cloud computing system 106.

In an operation 604, one or more layout option is received from middleware system 104. In an operation 606, one or more selection of the one or more layout option is provided to middleware system 104. In an operation 608, a layout is received from middleware system 104. In an illustrative embodiment, a user can make changes to the layout to determine how the appearance, cost, etc. change. In another illustrative embodiment, changes can be made to the layout by cloud computing system 106 and an updated layout can be provided to user computing device 102 in real time. The layout can be saved on user computing device 102, or remotely using middleware system 104 and/or cloud computing system 106.

Figure 7:
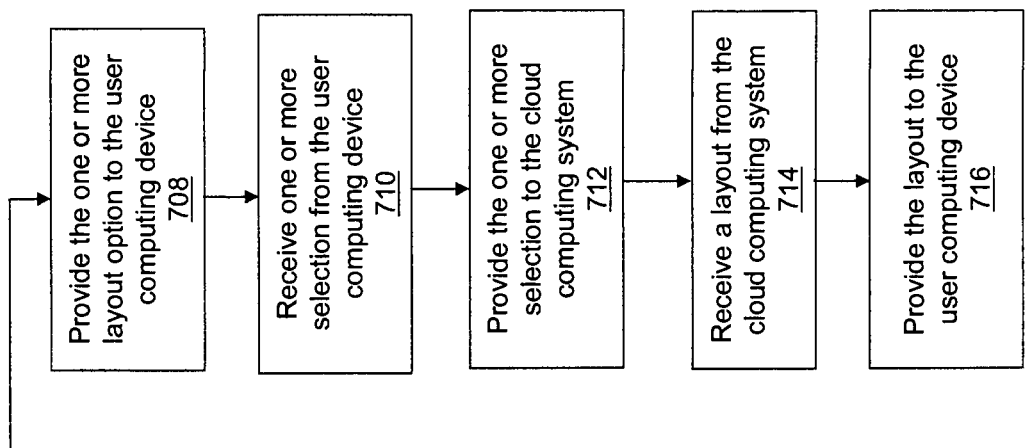
FIG. 7 depicts a flow diagram illustrating operations performed by the middleware system of FIG. 3 in accordance with an illustrative embodiment.

With reference to FIG. 7, illustrative operations performed by middleware system 104 are described. Additional, fewer, or different operations may be performed, depending on the embodiment. The order of presentation of the operations of FIG. 7 is not intended to be limiting. Middleware system 104 defines the parameters for processing a layout request from user computing device 102 using application programming interfaces, for example associated with operating system compatibility, display capability, media player capability, etc. Middleware system 104 defines similar parameters for interacting with cloud computing system 106.

In an operation 700, a layout request is received from user computing device 102. If the layout request identifies more than one space, the layout request may include information regarding a relationship between the spaces. Alternatively, the information regarding the relationship may be requested by cloud computing system after receipt of the layout request. In an operation 702, dimensions corresponding to one or more space are received. The dimensions can be received from user computing device 102 and/or from measurement device 116. In an operation 704, the layout request and the dimensions are provided to cloud computing system 106. In an operation 706, one or more layout option is received from cloud computing system 106. Alternatively, the one or more layout option may be stored at middleware system 104 for provision to user computing device 102 and/or cloud computing system 106. In an operation 708, the one or more layout option is provided to user computing device 102. In an operation 710, one or more selection is received from user computing device 102. In an operation 712, the one or more selection is provided to cloud computing system 106. In an operation 714, a layout is received from cloud computing system 106, and in an operation 716 the layout is provided to user computing device 102.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A device comprising:
   a processor; and
   a computer-readable medium including computer-readable instructions that, upon execution by the processor, cause the device to
      receive a first request from a second device, wherein the first request is a layout request that includes an identification of a space;
      provide a second request to a third device, wherein the second request includes the identification of the space;
      receive one or more dimension corresponding to the space, wherein the one or more dimension originates from a measurement device;
      provide the one or more dimension to the third device;
      receive a generated layout from the third device; and
      provide the generated layout to the second device.

2. The device of claim 1, wherein the computer-readable instructions further cause the device to:
   receive one or more layout option from the third device; and
   provide the one or more layout option to the second device.

3. The device of claim 2, wherein the computer-readable instructions further cause the device to:
   receive one or more layout selection corresponding to the one or more layout option from the second device; and
   provide the one or more layout selection to the third device.

4. The device of claim 3, wherein a first layout selection corresponds to a type of tile to be placed in the space and a second layout selection corresponds to a width of grout to be placed between tiles.

5. The device of claim 1, further comprising a layout determination interface application configured to provide an interface between the device and the second device and between the device and the third device.

6. The device of claim 5, wherein the second device uses a first operating system and the third device uses a second operating system.

7. The device of claim 1, wherein the generated layout is based at least in part on a stored layout that is designed at least in part by an expert.

8. The device of claim 1, wherein the space comprises a first space and a second space, and wherein the computer-readable instructions further cause the device to:
   receive information regarding a relationship between the first space and the second space from the second device; and provide the information regarding the relationship between the first space and the second space to the third device.

9. The device of claim 8, wherein the first space is at least partially adjacent to the second space, and further wherein the generated layout comprises a composite layout corresponding to the first space and the second space.

10. A system comprising:
   a first device comprising
      a first processor; and
      a first computer-readable medium including first computer-readable instructions that, upon execution by the first processor, cause the first device to
         receive a first request from a second device, wherein the first request is a layout request that includes an identification of a space;
         provide a second request to a third device, wherein the second request includes the identification of the space;
      receive one or more dimension corresponding to the space, wherein the one or more dimension originates from a measurement device;
      provide the one or more dimension to the third device;
      receive a layout from the third device; and
      provide the generated layout to the second device; and
   the third device comprising
      a second processor; and
      a second computer-readable medium including second computer-readable instructions that, upon execution by the second processor, cause the third device to
         receive the second request and the one or more dimension from the first device;
         generate a layout based at least in part on the identification of the space and the one or more dimension; and
         provide the generated layout to the first device.

11. The system of claim 10, wherein the space comprises a first space and a second space, and wherein the second computer-readable instructions further cause the third device to:
   receive information regarding a relationship between the first space and the second space from the first device, wherein the relationship indicates that the first space is at least partially adjacent to the second space; and
   determine a composite area corresponding to the first space and the second space.

12. The system of claim 10, wherein the second computer-readable instructions further cause the third device to:
   access a stored layout, wherein in the stored layout is created at least in part by a design expert; and
   use the stored layout to generate the layout.

13. The system of claim 10, wherein the measurement device comprises an automated laser-based measurement device.

14. The system of claim 10, wherein the second computer-readable instructions further cause the third device to identify one or more layout option based at least in part on the identification of the space.

* * * * *

UNITED STATES PATENT AND TRADEMARK OFFICE
CERTIFICATE OF CORRECTION

| | | |
|---|---|---|
| PATENT NO. | : 8,694,932 B2 | Page 1 of 1 |
| APPLICATION NO. | : 12/200271 | |
| DATED | : April 8, 2014 | |
| INVENTOR(S) | : Fein et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1225 days.

Signed and Sealed this
Sixteenth Day of June, 2015

Michelle K. Lee
*Director of the United States Patent and Trademark Office*